United States Patent
Namishia et al.

(10) Patent No.: US 12,315,836 B2
(45) Date of Patent: May 27, 2025

(54) LIMITING FAILURES CAUSED BY DENDRITE GROWTH ON SEMICONDUCTOR CHIPS

(71) Applicant: Wolfspeed, Inc., Durham, NC (US)

(72) Inventors: Dan Namishia, Wake Forest, NC (US); Mitch Flowers, Durham, NC (US); Eng Wah Woo, Ipoh (MY); Erwin Cohen, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 583 days.

(21) Appl. No.: 17/567,322

(22) Filed: Jan. 3, 2022

(65) Prior Publication Data

US 2023/0215833 A1    Jul. 6, 2023

(51) Int. Cl.
*H01L 23/00* (2006.01)

(52) U.S. Cl.
CPC .............. *H01L 24/32* (2013.01); *H01L 24/29* (2013.01); *H01L 24/48* (2013.01); *H01L 24/73* (2013.01); *H01L 2224/29139* (2013.01); *H01L 2224/32225* (2013.01); *H01L 2224/48225* (2013.01); *H01L 2224/73265* (2013.01); *H01L 2924/10156* (2013.01); *H01L 2924/10272* (2013.01); *H01L 2924/1033* (2013.01); *H01L 2924/13064* (2013.01); *H01L 2924/13091* (2013.01); *H01L 2924/1423* (2013.01)

(58) Field of Classification Search
CPC ... H01L 23/49575; H01L 23/36; H01L 23/66; H01L 2924/10156; H01L 2924/13091; H01L 24/29; H01L 24/32; H01L 24/83; H01L 2224/29139; H01L 2224/48225; H01L 2924/13064; H01L 2924/1423; H01L 24/48; H01L 24/73
See application file for complete search history.

(56) References Cited

U.S. PATENT DOCUMENTS

| | | | |
|---|---|---|---|
| 10,276,421 B2* | 4/2019 | Liao | H01L 24/32 |
| 10,403,578 B2* | 9/2019 | Raorane | H01L 23/498 |
| 11,031,350 B2* | 6/2021 | Talledo | H01L 21/4842 |
| 2004/0089922 A1* | 5/2004 | Gerber | H01L 23/3185 257/E29.022 |
| 2006/0255478 A1* | 11/2006 | Hagen | H01L 21/56 257/E29.022 |
| 2014/0138833 A1* | 5/2014 | Seng | H01L 24/05 257/751 |
| 2017/0186719 A1* | 6/2017 | Kira | H01L 21/563 |

(Continued)

Primary Examiner — Khiem D Nguyen
(74) Attorney, Agent, or Firm — COATS & BENNETT, PLLC

(57) ABSTRACT

A semiconductor chip comprises a substrate, a die attach material, and a die. The substrate comprises an upper surface and a lower surface opposing the upper surface. The die attach material is on the upper surface of the substrate. The die comprises a bottom surface bonded to the upper surface of the substrate by the die attach material, a top surface opposing the bottom surface, and a side wall adjacent to the top surface and the bottom surface. A shortest distance across an exterior of the side wall from the bottom surface to the top surface defines an exterior surface distance. The die further comprises a die height measured from where the side wall meets the bottom surface to where the side wall meets the top surface. The exterior surface distance is longer than the die height.

29 Claims, 6 Drawing Sheets

(56) References Cited

U.S. PATENT DOCUMENTS

2018/0130722 A1\* 5/2018 Wall ........................ H01L 24/06
2019/0043823 A1\* 2/2019 Venkatadri ............ H01L 21/563
2019/0131939 A1\* 5/2019 Shapoury ............. H01Q 3/2658

\* cited by examiner

LIMITING FAILURES CAUSED BY DENDRITE GROWTH ON SEMICONDUCTOR CHIPS

BACKGROUND

In the field of electronics, semiconductor chips are often subject to a phenomenon known as electrochemical migration (ECM). ECM often results in the growth of conductive metal filaments called dendrites. Dendritic growth is a significant problem in the field of electronics because, as these dendrites grow, they can bridge conductors that were not designed to be bridged, resulting in operational failures.

Moreover, the failures caused by dendritic growth can be frustrating to diagnose. For example, if a dendrite has a small cross-section and is subject to a high current upon bridging connections, the dendrite may short an electrical connection and then quickly burn away. As a result, an electronic component experiencing dendrite growth may fail intermittently, thereby impeding engineers from identifying a root cause of the failure.

SUMMARY

It is an object of the present disclosure to provide electronics in a form that limits, avoids, or prevents the otherwise deleterious effects of metal dendrite growth. Particular embodiments disclosed herein propose semiconductor chips that are designed to increase the amount of dendritic growth required before a failure condition is encountered. Among other things, the design of particular embodiments is more resilient against the formation of metal dendrites due to the migration of metallic material comprised in particular die attach materials. In this regard, the ability of a dendrite to form from such metallic die attach material and bridge a circuit on the die to someplace unintended (e.g., ground) is impeded, frustrated, or avoided by the design of embodiments disclosed herein.

Embodiments of the present disclosure include a semiconductor chip comprising a substrate comprising an upper surface and a lower surface opposing the upper surface. The semiconductor chip further comprises a die attach material on the upper surface of the substrate and a die. The die comprises a bottom surface bonded to the upper surface of the substrate by the die attach material, a top surface opposing the bottom surface, and a side wall. The side wall is adjacent to the top surface and the bottom surface. A shortest distance across an exterior of the side wall from the bottom surface to the top surface defines an exterior surface distance. Further, a die height is measured from where the side wall meets the bottom surface to where the side wall meets the top surface. The exterior surface distance is longer than the die height.

In some embodiments, the side wall comprises a first vertical surface, a second vertical surface, and an intermediate surface that is adjacent, and substantially perpendicular to, each of the vertical surfaces.

In some embodiments, the side wall comprises a first vertical surface, a second vertical surface, and an intermediate surface that is adjacent to each of the vertical surfaces. The intermediate surface forms interior angles with the first and second vertical surfaces and one of the interior angles is between thirty-five degrees and fifty-five degrees.

In some embodiments, the side wall comprises a first vertical surface, a second vertical surface, and an intermediate surface that is adjacent to each of the vertical surfaces. The intermediate surface is spaced over the die attach material.

In some embodiments, the side wall comprises a first vertical surface adjacent to the top surface, a second vertical surface adjacent to the bottom surface, and an intermediate surface that is adjacent to each of the vertical surfaces. The intermediate surface forms an acute exterior angle with the first vertical surface and an acute interior angle with the second vertical surface.

In some embodiments, the side wall comprises a first vertical surface, a second vertical surface, a first intermediate surface, and a second intermediate surface. The first intermediate surface and the first vertical surface meet to form an exterior obtuse angle. The second intermediate surface and the second vertical surface meet to form an acute interior angle.

In some embodiments, the side wall comprises a first vertical surface, a second vertical surface, a first intermediate surface, a second intermediate surface, and a third intermediate surface. The side wall further comprises a plurality of substantially perpendicular angles formed at respective intersections of the first and second intermediate surfaces, the second and third intermediate surfaces, the first vertical surface and the first intermediate surface, and the second vertical surface and the third intermediate surface.

In some embodiments, the side wall comprises a first vertical surface adjacent to the top surface, a second vertical surface adjacent to the bottom surface, and an intermediate surface that is adjacent to each of the vertical surfaces. The intermediate surface is curved such that a concave cavity in the side wall is formed. Further, the intermediate surface increasingly straightens as the intermediate surface approaches the first vertical surface. Further, the intermediate surface forms an acute interior angle with the second vertical surface.

In some embodiments, the side wall comprises a first vertical surface adjacent to the top surface, a second vertical surface adjacent to the bottom surface, and an intermediate surface that is adjacent to each of the vertical surfaces. The first vertical surface is curved such that a concave cavity in the side wall is formed. The intermediate surface is curved in a direction opposite that of the first vertical surface such that a protrusion is formed. Further, the intermediate surface increasingly straightens as the intermediate surface approaches the second vertical surface.

In some embodiments, the die attach material is silver sintered.

In some embodiments, the exterior surface distance is longer than the die height by at least 5 microns.

In some embodiments, the semiconductor chip is air cavity packaged.

In some embodiments, the semiconductor chip further comprises a gallium nitride-based high-electron-mobility transistor.

In some embodiments, the semiconductor chip further comprises a gallium nitride-based monolithic microwave integrated circuit.

In some embodiments, the semiconductor chip further comprises a gallium nitride-based transistor grown on silicon carbide.

In some embodiments, the semiconductor chip further comprises a silicon carbide-based metal-oxide-semiconductor field-effect transistor.

Other embodiments of the present disclosure include a semiconductor chip comprising a substrate, a die attach material, and a die. The substrate comprises an upper surface and a lower surface opposing the upper surface. The die attach material is on the upper surface of the substrate. The die comprises a bottom surface bonded to the upper surface of the substrate by the die attach material and a top surface that opposes, and is narrower than, the bottom surface. The die further comprises a side wall adjacent to the top surface and the bottom surface, wherein the side wall comprises a recess that is at least 5 microns deep and that extends around a perimeter of the die.

In some embodiments, the side wall comprises a first vertical surface, a second vertical surface, and an intermediate surface that is adjacent, and substantially perpendicular to, each of the vertical surfaces.

In some embodiments, the side wall comprises a first vertical surface, a second vertical surface, and an intermediate surface that is adjacent to each of the vertical surfaces. The intermediate surface forms interior angles with the first and second vertical surfaces and one of the interior angles is between thirty-five degrees and fifty-five degrees.

In some embodiments, the side wall comprises a first vertical surface, a second vertical surface, and an intermediate surface that is adjacent to each of the vertical surfaces. The intermediate surface is spaced over the die attach material.

In some embodiments, the side wall comprises a first vertical surface adjacent to the top surface, a second vertical surface adjacent to the bottom surface, and an intermediate surface that is adjacent to each of the vertical surfaces. The intermediate surface forms an acute exterior angle with the first vertical surface and an acute interior angle with the second vertical surface.

In some embodiments, the side wall comprises a first vertical surface, a second vertical surface, a first intermediate surface, and a second intermediate surface. The first intermediate surface and the first vertical surface meet to form an exterior obtuse angle. The second intermediate surface and the second vertical surface meet to form an acute interior angle.

In some embodiments, the side wall comprises a first vertical surface, a second vertical surface, a first intermediate surface, a second intermediate surface, and a third intermediate surface. The side wall further comprises a plurality of substantially perpendicular angles formed at respective intersections of the first and second intermediate surfaces, the second and third intermediate surfaces, the first vertical surface and the first intermediate surface, and the second vertical surface and the third intermediate surface.

In some embodiments, the side wall comprises a first vertical surface adjacent to the top surface, a second vertical surface adjacent to the bottom surface, and an intermediate surface that is adjacent to each of the vertical surfaces. The intermediate surface is curved such that a concave cavity in the side wall is formed. The intermediate surface increasingly straightens as the intermediate surface approaches the first vertical surface. The intermediate surface forms an acute interior angle with the second vertical surface.

In some embodiments, the side wall comprises a first vertical surface adjacent to the top surface, a second vertical surface adjacent to the bottom surface, and an intermediate surface that is adjacent to each of the vertical surfaces. The first vertical surface is curved such that a concave cavity in the side wall is formed. The intermediate surface is curved in a direction opposite that of the first vertical surface such that a protrusion is formed. The intermediate surface increasingly straightens as the intermediate surface approaches the second vertical surface.

In some embodiments, the die attach material is silver sintered.

In some embodiments, the semiconductor chip is air cavity packaged.

In some embodiments, the semiconductor chip further comprises a gallium nitride-based high-electron-mobility transistor.

In some embodiments, the semiconductor chip further comprises a gallium nitride-based monolithic microwave integrated circuit.

In some embodiments, the semiconductor chip further comprises a gallium nitride-based transistor grown on silicon carbide.

In some embodiments, the semiconductor chip further comprises a silicon carbide-based metal-oxide-semiconductor field-effect transistor.

BRIEF DESCRIPTION OF THE DRAWINGS

Aspects of the present disclosure are illustrated by way of example and are not limited by the accompanying figures with like references indicating like elements. In general, the use of a reference numeral should be regarded as referring to the depicted subject matter according to one or more embodiments, whereas discussion of a specific instance of an illustrated element will append a letter designation thereto (e.g., discussion of a die 20, generally, as opposed to discussion of particular instances of dies 20a, 20b).

DETAILED DESCRIPTION

Figure 1A:
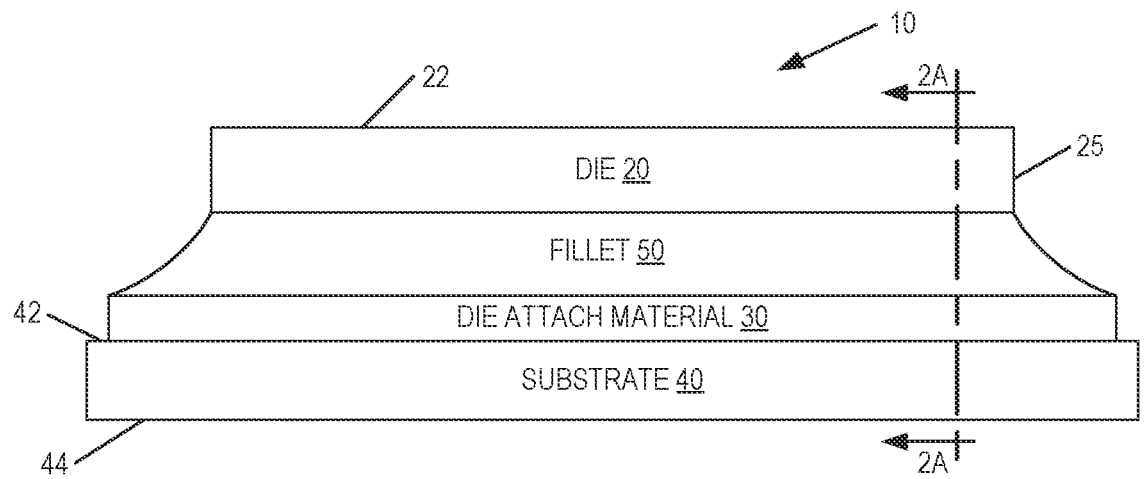
FIG. 1A is a schematic block diagram illustrating a side view of an example semiconductor chip, according to one or more embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
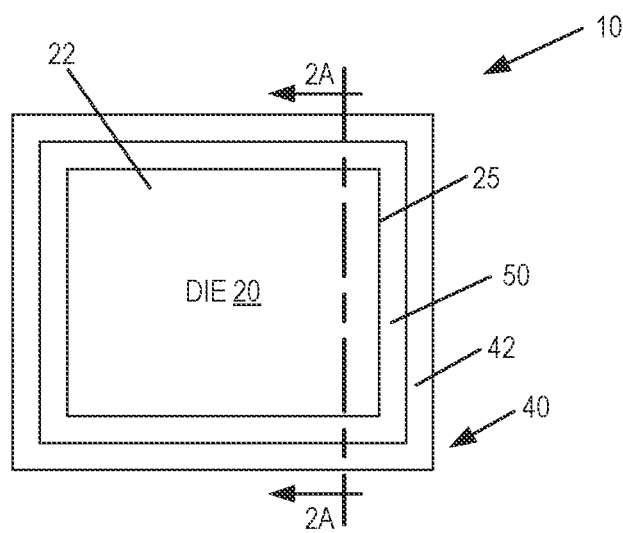
FIG. 1B is a schematic block diagram illustrating a top view of an example semiconductor chip, according to one or more embodiments of the present disclosure.

FIGS. 1A and 1B are schematic block diagrams illustrating a side view and a top view, respectively, of an example semiconductor chip 10. The semiconductor chip 10 comprises a substrate 40, a die 20, and a die attach material 30 that bonds the die 20 to the substrate 40. As can be best appreciated from FIG. 1B, the die 20 is substantially square as viewed from the top. Thus, the side view of FIG. 1A may essentially depict the semiconductor chip 10 from any side, as the sides of the die 20 are substantially symmetrical.

For clarity, the term "substantially" as used herein to describe certain physical features means that incidental variations due to the limitations of engineering precision, natural imperfections, and the like are considered to be within scope. For example, the shapes of two surfaces are considered to be substantially the same if they would be exactly the same but for natural microscopic pitting in the material, variations due to uneven thermal expansion, and/or other deviances that are understood to exist but are beyond the reasonable control of the manufacturing process.

The substrate 40 comprises an upper surface 42 and a lower surface 44 that opposes the upper surface 42. The substrate further comprises an electrically conductive material, e.g., copper. This electrically conductive material may be formed into a metal base or lead frame. Among other things, the substrate 40 may provide a ground or electrical pathways to transfer electrical signals from the semiconductor chip 10 to other components.

The die 20 comprises a top surface 22, a bottom surface 24, and a side wall 25. The top surface 22 opposes the bottom surface 24, (the latter of which cannot be seen in FIGS. 1A and 1B but will be shown in subsequent figures). The side wall 25 is adjacent to both the top surface 22 and the bottom surface 24.

The bottom surface 24 of the die 20 is bonded to an upper surface 42 of the substrate 40 by a die attach material 30. The die attach material 30 may be an adhesive, film, solder, sintered, or other material. In some embodiments, the die attach material 30 may include metallic materials. For example, the die attach material may comprise gold tin (AuSn), sintered gold, or sintered silver. Silver sintered die attach material typically comprises tiny silver particles for approximately 75-90% of its bulk volume and volatile organics for the remainder. Advantageously, sintered silver is a relatively inexpensive material despite its impressive thermal properties. In contrast, sintered gold tends to be far more expensive and may provide less predictable results.

The die attach material 30 provides a high thermal conductivity path to both dissipate high power through the material as well as a strong mechanical attachment of the die 20 to the substrate 40. The die attach material 30 may be dispensed from a needle or screen printed onto the upper surface 42 of the substrate 40. The die 20 may then be placed upon (and possibly pressed into) the die attach material 30, which may then be cured and hardened.

The process of attaching the die 20 to the substrate 40 may cause the die attach material 30 to be displaced and form a fillet 50 around the side wall 25 of the die 20. For example, the die attach material 30 under the bottom surface 24 of the die 20 may be squeezed out from under the die 20 and accumulate laterally around the die 20.

Figure 2A:
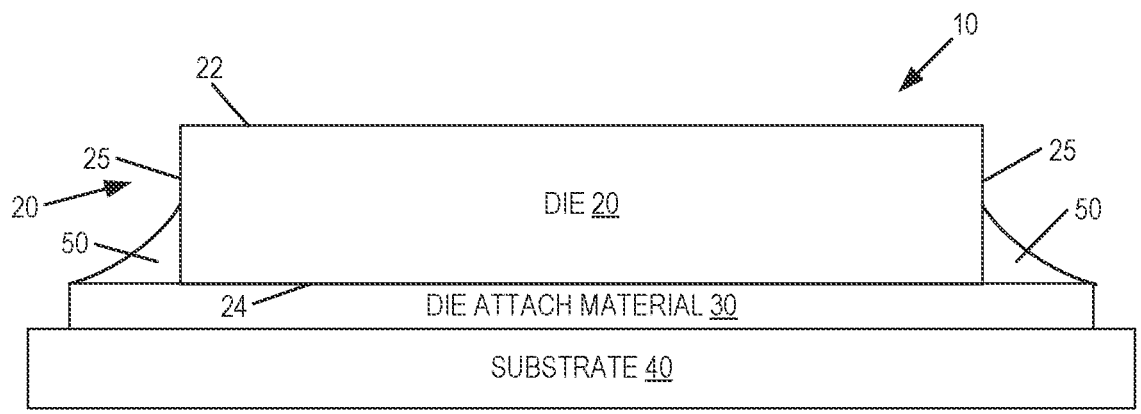
FIG. 2A is a schematic block diagram illustrating a section side view of the example semiconductor chip depicted in FIGS. 1A and 1B.

The die 20 further comprises one or more semiconductive materials that form circuitry, such as a discrete or integrated circuit. In some embodiments, the circuitry may be a Monolithic Microwave Integrated Circuit (MMIC). FIG. 2A is a section view of the semiconductor chip 10 showing that shows the bottom surface 24, side wall 25, and top surface 22 of the die 20 in greater detail. In this particular example, the top surface 22 of the die 20 is exposed to the air. Accordingly, the die 20 may be referred to as an open cavity or air cavity die.

The semiconductive materials comprised in the die 20 may include (but are not limited to) gallium nitride (GaN), silicon carbide (SiC), silicon (Si), Aluminum Gallium Nitride (AlGaN), and/or germanium (Ge). In this regard, Gan-on-SiC may be an advantageous choice when the semiconductor chip is intended for use in high Radio Frequency (RF) electronics due to its high thermal conductivity and good lattice matching. The high thermal conductivity is generally advantageous because such tends to allow for large amounts of heat to be dissipated even in relatively compact packages, thereby enabling high power density electronics. Further, because the lattice structures between the epitaxial layers of GaN on SiC align quite well, a band gap change can often be formed without introducing changes to the crystalline structure of the materials involved. Avoiding the need for such adjustments generally improves the reliability of the product. The use of GaN-on-SiC may further be enabled by the use of a sintered silver die attach material 30, which is generally able to absorb the high coefficient of thermal expansion mismatches that a GaN-on-SiC MMIC on a copper substrate is likely to demonstrate.

The die 20 may include, in some embodiments, one or more electrical structures for connection to one or more other components. For example, the die 20 may comprise one or more vias, traces, plates, and/or pads at the bottom surface 24 so that the die 20 may be connected to a ground and/or a lead frame at the substrate 40. The die 20 may additionally or alternatively be connected at the top surface 22 to one or more other components via one or more bond wires. The particular layout and positioning of the circuitry of the die 20 can vary greatly depending on the embodiment and are therefore omitted from the figures.

Figure 2B:
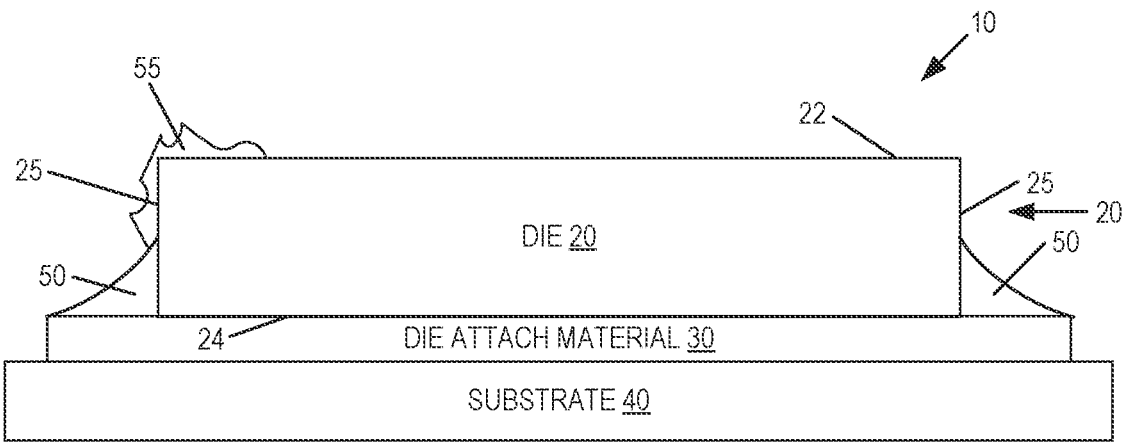
FIG. 2B is a schematic block diagram illustrating a section side view of the example semiconductor chip depicted in FIGS. 1A and 1B experiencing metal dendrite growth.

Problems due to ECM can arise once the semiconductor chip 10 is operational. For example, when the die attach material 30 is silver sintered and is in the presence of a negative electric field (particularly in the presence of moisture), the silver ions in the die attach material 30 can migrate up the side wall 25 of the die 20 resulting in metal dendrite growth 55, as shown in FIG. 2B. This metal dendrite growth 55 can cause the semiconductor chip 10 to fail, e.g., by shorting a gate of the die 20 to ground. If the die 20 is an open cavity package housing a GaN MMIC for example, the die attach material 30 is likely to be exposed to a negative electric field that would promote metal dendrite growth 55 of this kind and would likely be vulnerable to failures of this sort.

While certain packaging techniques (e.g., plastic overmold) may avoid this issue by safely encapsulating the die 20, the use of large amounts of plastic can introduce parasitic loading that may prevent the semiconductor chip 10 from scaling to higher RF frequencies. Thus, an open cavity package is more likely to be used in solutions that require higher performance, e.g., in MMIC products that scale up into $K_u$ band and beyond.

Problems introduced due to the growth of metal dendrites may be exacerbated depending on the height of the fillet 50 relative to the height of the side wall 25. The degree to which the die attach material 30 extends from the bottom surface 24 up the side wall 25 toward the top surface 22 of the die 20 is often expressed in terms of a "percentage fillet." With a high fillet, in proper conditions for metal dendrite growth 55, dendrites would have little distance to grow before reaching over the side wall 25 and shorting out the die circuitry 29.

One approach to combating the negative effects of metal dendrite growth 55 is to design the semiconductor chip 10 to have a low (possibly zero) fillet 50. However, such an approach may not be feasible for all solutions. For example, a low fillet 50 may weaken the ability of the semiconductor chip 10 to pass temperature cycling qualification stress tests, as the fillet 50 often acts to mechanically stabilize and reinforce the packaging system against forces that are present at the temperature extremes to which the semiconductor chip 10 is rated. Thus, temperature cycle and dendrite avoidance requirements may compete with one another, thereby requiring precision process control, e.g., during high-volume package assembly.

Given that simply lowering the fillet 50 is not necessarily viable, embodiments of the present disclosure propose to vary the shape of the side wall 25 to reduce the likelihood that metal dendrite growth 55 will interfere with the intended operation of the die 20. In the example embodiment illustrated in FIG. 2C, a recess 21 has been cut in the side wall 25 around the perimeter of the die 20 in a substantially symmetric fashion. As shown, the resulting side wall 25 comprises a shelf 60. The recess 21 and shelf 60 of the side wall 25 facilitate easier and more precise control of the fillet 50 at a target height. Further, the more complex side wall 25 of FIG. 2C has a longer distance and more difficult geometry for metal dendrites to traverse as compared to the side wall 25 of FIGS. 2A and 2B (should metal dendrite growth 55 occur). The design of the side wall 25 may, in some embodiments, also prevent fillet wicking, simplify fillet inspection, and/or weaker e-field interaction to metal ions in the die attach material 30, among other potential benefits. In some embodiments, the recess may additionally be filled, in whole or in part, by a barrier material that impedes dendrite growth.

Figure 2C:
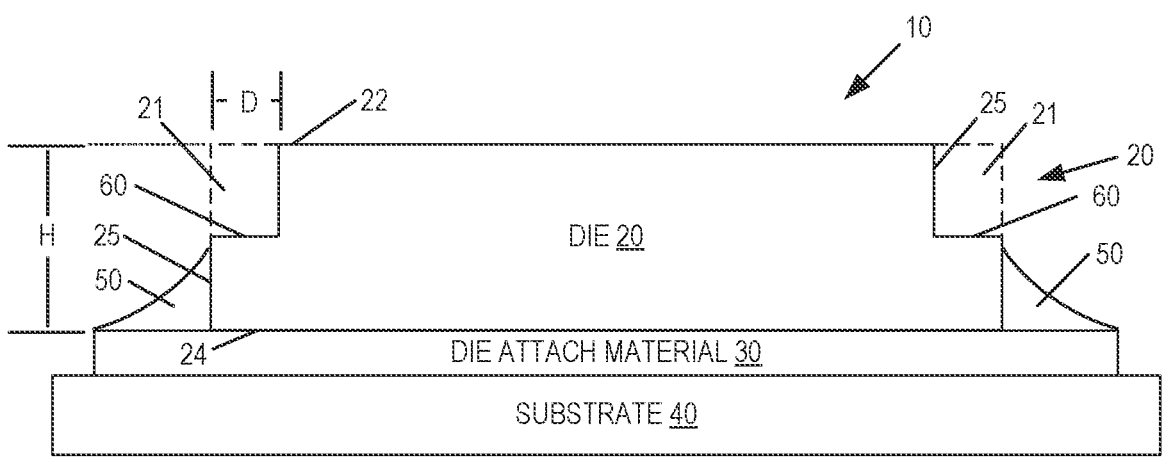
FIG. 2C is a schematic block diagram illustrating a section side view of an example semiconductor chip comprising a recess, according to one or more embodiments of the present disclosure.

Certain advantageous properties of the design of FIG. 2C can be understood by considering the dimensions of certain elements. Consider that the die 20 has a height as shown by dimension H. The height is measured from where the side wall 25 meets the bottom surface 24 to where the side wall 25 meets the top surface 22. Due to the addition of the recess 21, the side wall 21 has a shelf 60 that extends an exterior surface distance of the side wall 25 by the length of the shelf 60, as shown by dimension D. The shortest distance across the exterior of the side wall 55 between where the side wall 25 meets the top and bottom surfaces 22, 24 can be expressed as the die height H plus the shelf depth D in this example. Thus, this exterior surface distance of the side wall 25 is longer than the die height when the two are measured between the same locations (i.e., the top and bottom surfaces 22, 24). These geometric properties of are a result of designing the side wall 25 to include the recess 21 and shelf 60.

Given that the fillet 50 is below the height of the shelf 60 in this example, the shelf depth D is an additional distance that metal dendrite growth 55 would have to travel in order to extend from the fillet 50 to the top surface 22 as compared to the examples of FIGS. 2A and 2B. In some embodiments, the depth of the recess 21 (i.e., from the outermost portion of the side wall 25 to the innermost portion of the side wall 25) is at least 5 microns. In other embodiments, the depth of the recess 21 is at least 10 microns. As will be discussed in greater detail below, the depth of the recess 21 may be established through the use of certain cutting techniques during the die singulation process to increase the exterior surface distance of the side wall 25 beyond the die height by various distances. Although a variety of geometries of the side wall 25 are supported by the techniques disclosed herein, particularly advantageous embodiments include an exterior surface distance of the side wall 25 that is longer than the die height by at least 5 microns but not more than 35 microns.

Figure 3A:
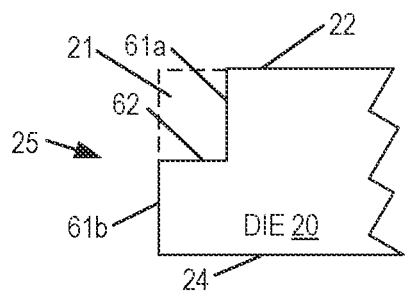
FIGS. 3A-3H are schematic block diagrams illustrating different example side walls of the die of a semiconductor chip, according to respective embodiments of the present disclosure.

FIG. 3A schematically illustrates the side wall 25 of FIG. 2C in greater detail. The side wall 25 of FIG. 3A comprises a first vertical surface 61a, a second vertical surface 61b, and an intermediate surface 62 that is adjacent, and substantially perpendicular to, each of the vertical surfaces 61a, 61b. The first vertical surface 61a extends downward from the top surface 22 towards the bottom surface 24. The second vertical surface 61b extends upward from the bottom surface 24 towards the top surface 22. The intermediate surface 62 forms the shelf 60 described above.

Figure 3B:
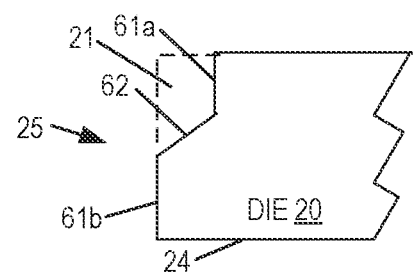

In general, by increasing the complexity of the side wall 25 over traditional approaches, the side wall 25 can structurally inhibit metal dendrite growth 55 from interfering with the operation of the die 20, e.g., by preventing metal dendrite growth 55 from climbing over the top surface 22 to where the circuitry of the die 20 may be exposed. That said, the side wall 25 may be designed differently depending on the embodiment. In this regard, FIG. 3B schematically illustrates a different example of the side wall 25. The side wall 25 of FIG. 3B comprises a first vertical surface 61a, a second vertical surface 61b, and an intermediate surface 62 that is adjacent to each of the vertical surfaces. The intermediate surface 62 of FIG. 3B forms interior angles with the first and second vertical surfaces 61a, 61b. In contrast to FIG. 3A, one of the interior angles in FIG. 3B is between thirty-five degrees and fifty-five degrees. In some particular embodiments, the interior angles are substantially supplementary. In this example, the intermediate surface 62 is beveled relative to the vertical surfaces 61a, 61b, as opposed to the squared intermediate surface 62 of FIG. 3A.

Figure 3C:
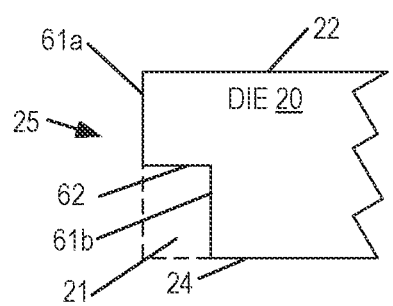

While the recess 21 of the side wall 25 depicted in FIGS. 3A and 3B shown to be at the top surface 22 of the die 20, in other embodiments, the recess 21 may instead be at the bottom surface 24, e.g., as illustrated in FIG. 3C. Thus, the side wall 25 of FIG. 3C forms an overhang that is spaced over the die attach material 30 (i.e., and any fillet 50 thereof). This overhang serves to impede metal dendrite growth 55.

Embodiments in which the recess is disposed in the side wall 25 at the bottom surface 24 of the die 20 are not limited to the embodiment depicted in FIG. 3C. Indeed, for any embodiment disclosed herein in which the recess 21 is depicted as being disposed in the side wall 25 at the top surface 22, a corresponding inverted embodiment in which a similar recess 21 is formed at the bottom surface 24 should also be understood to be disclosed herein.

Figure 3D:
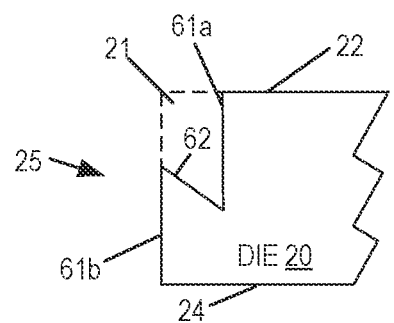

FIG. 3D schematically illustrates another example of the side wall 25. In the example of FIG. 3D, the side wall 25 comprises a first vertical surface 61a, a second vertical surface 61b, and an intermediate surface 62. The intermediate surface 62 is adjacent to each of the vertical surfaces 61a, 61b and forms an acute interior angle with one of the vertical surfaces 61a, 61b and an acute exterior angle with the other of the vertical surfaces 61a, 61b. In this particular example, the intermediate surface 62 forms an acute interior angle with vertical surface 61b and an acute exterior angle with vertical surface 61a.

Figure 3E:
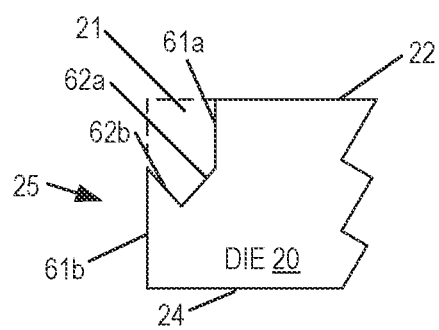

FIG. 3E schematically illustrates another example of the side wall 25. In the example of FIG. 3E, the side wall 25 comprises a first vertical surface 61a, a second vertical surface 61b, a first intermediate surface 62a, and a second intermediate surface 62b. The intermediate surfaces 62a, 62b are adjacent to each other and meet to form an exterior angle that is either acute or obtuse. Each of the intermediate surfaces 62a, 62b is adjacent to a respective one of the vertical surfaces 61a, 61b. The second intermediate surface 62b and the second vertical surface 61b meet to form an interior acute angle. The first intermediate surface 62a and the first vertical surface 61a meet to form an exterior obtuse angle.

Figure 3F:
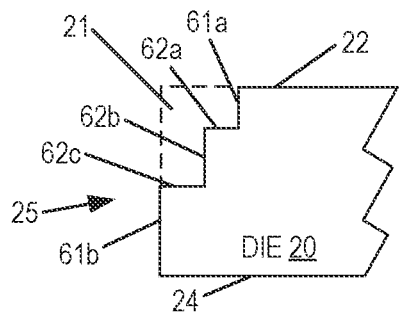

FIG. 3F schematically illustrates another example of the side wall 25. In the example of FIG. 3F, the side wall 25 comprises a first vertical surface 61a, a second vertical surface 61b, a first intermediate surface 62a, a second intermediate surface 62b, and a third intermediate surface 62c. The first and second intermediate surfaces 62a, 62b are adjacent to each other and meet to form an angle that is substantially perpendicular. The second and third intermediate surfaces 62b, 62c are adjacent to each other and also meet to form an angle that is substantially perpendicular. In this regard, the first intermediate surface 62a and the third intermediate surface 62c each form a respective shelf. The first intermediate surface and the third intermediate surface 62a, 62c are each adjacent to a respective one of the vertical surfaces 61a, 61b.

Figure 3G:
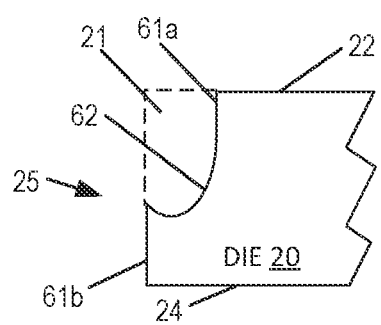

In the previous examples, the vertical and intermediate surfaces 61, 62 were substantially planar. That said, other embodiments include a side wall 25 comprising one or more curved surfaces. FIG. 3G schematically illustrates one such embodiment. In the example of FIG. 3G, the side wall 25 comprises a first vertical surface 61a, a second vertical surface 61b, and an intermediate surface 62 that is curved. The intermediate surface 62 is adjacent to each of the vertical surfaces 61a, 61b and curves to form a concave cavity in the recess 21 of the side wall 25. The intermediate surface 62 and the second vertical surface 61b meet to form an acute interior angle. The intermediate surface 62 and the first vertical surface 61a meet such that the side wall 25 smoothly transitions from curved to substantially planar.

Figure 3H:
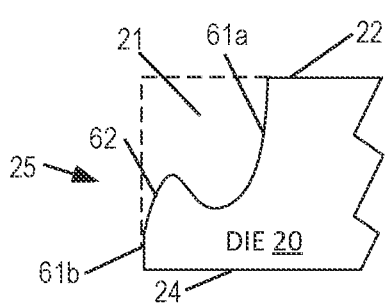

Although FIG. 3G depicts an embodiment in which only the intermediate surface 62 is curved, other embodiments include more than one curved surface, any of which may be an intermediate surface 62 or a vertical surface 61. FIG. 3H schematically illustrates an example in which the side wall 25 comprises a first vertical surface 61a that is curved, a second vertical surface 61b that is substantially planar, and an intermediate surface 62 that is curved. The first vertical surface 61a and the intermediate surface 62 are adjacent to each other and curve in opposing directions. The first vertical surface 61a curves to form a concave cavity in the recess 21 of the side wall 25. The intermediate surface 62 curves to form a raised protrusion into the recess 21. The intermediate surface 62 and the second vertical surface 61b meet such that the side wall 25 smoothly transitions from curved to substantially planar.

The shape of the side wall 25 may be produced during die singulation through various cutting techniques. In some embodiments, the process for forming the side wall 25 of the die 20 may comprise one or more cuts. Each of the cuts may be performed using an appropriate tool, such as a saw or a laser. The one or more cuts include a separation cut that separates the die 20 from one or more neighboring dies. The one or more cuts may additionally include one or more shaping cuts for forming the recess 21.

Figure 4A:
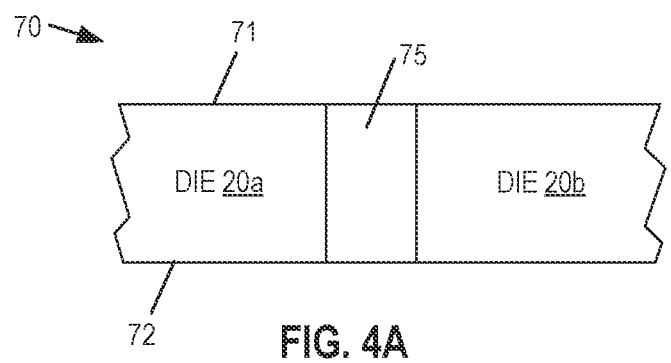
FIG. 4A is a schematic block diagram illustrating an example wafer comprising a plurality of dies, according to one or more embodiments of the present disclosure.

FIG. 4A is a schematic block diagram illustrating part of a wafer 70 from the side. The wafer comprises a plurality of dies 20a, 20b, a die street 75, a proximal surface 71 and a distal surface 72 that opposes the proximal surface 71.

Figure 4B:
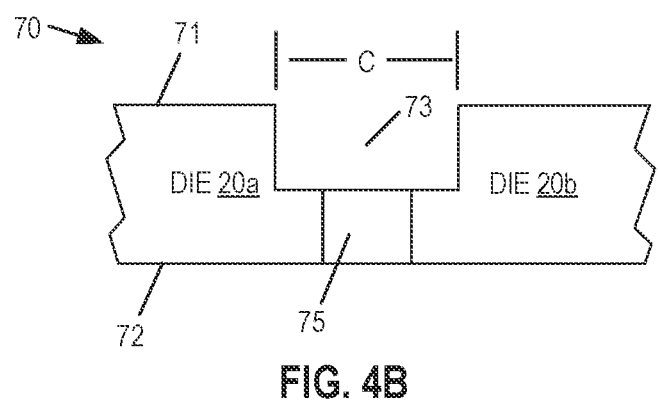
FIG. 4B is a schematic block diagram illustrating the example wafer of FIG. 4A after a shaping cut has been made, according to one or more embodiments of the present disclosure.

A shaping cut may be applied to the proximal surface 71 of the wafer 70 at the die street 75. The shaping cut removes material from the wafer 70 but does not extend all the way through the wafer 70, as shown in FIG. 4B. The shaping cut may be performed, e.g., by a saw having a width of dimension C so as to create a correspondingly sized cavity 73 in the wafer 70. In one particular example, the shaping cut is performed by a saw blade that is 40 microns wide.

Figure 4C:
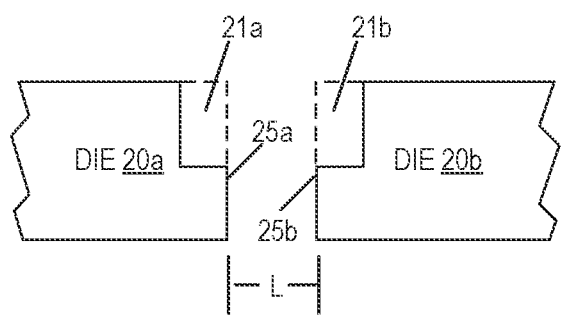
FIG. 4C is a schematic block diagram illustrating the example wafer of FIG. 4B after a separation cut has been made, according to one or more embodiments of the present disclosure.

The shaping cut may be followed by a separation cut applied into the cavity 73 at the die street 75. The separation cut extends all the way through the wafer, eliminating the die street 75, separating the dies 20a, 20b from each other, and completing the shape of their respective side walls 25a, 25b. In one particular example, the separation cut is performed by a saw blade that is 20 microns wide. In another example, the separation cut is performed by a laser that ablates material from the wafer across a 20-micron width. The width of the separation cut is shown in FIG. 4C by dimension L. As can be seen from FIG. 4C, the shaping cut(s) may be performed such that the recesses 21a, 21b of multiple dies 21a, 21b may be formed jointly. Once the dies 20a, 20b have been separated from each other, each may be bonded to the same or respective substrates 40 as previously described.

While the various embodiments described above discuss a recess 21 in the side wall 25 of the die 20 that is essentially empty and exposed to the air, other embodiments include a recess that is filled in whole or in part by a barrier material. In some embodiments, this barrier material may physically obstruct metal dendrite growth 55 from reaching the top surface 22 of the die 20, e.g., by sealing the die attach material 30 and/or the die 20. In this regard, the barrier material may be a plastic, epoxy, or other suitable substance.

The semiconductor chip 10 may be packaged in a variety of ways, depending on the particular embodiment. For example, the semiconductor chip 10 may be included in a semiconductor package such as an open cavity package. In such embodiments, the semiconductor chip 10 may be attached to a copper or copper alloy flange with an open cavity ceramic or plastic lid. Alternatively, the semiconductor package may be included in a module or system in which the die 20 is simply being attached to a submount or circuit board. In some embodiments, the substrate 40 is a SiC growth substrate with SIC epitaxial layers. For example, the electronics chip 10 may be a silicon carbide transistor such as a metal oxide semiconductor field effect transistor (MOSFET).

Figure 5A:
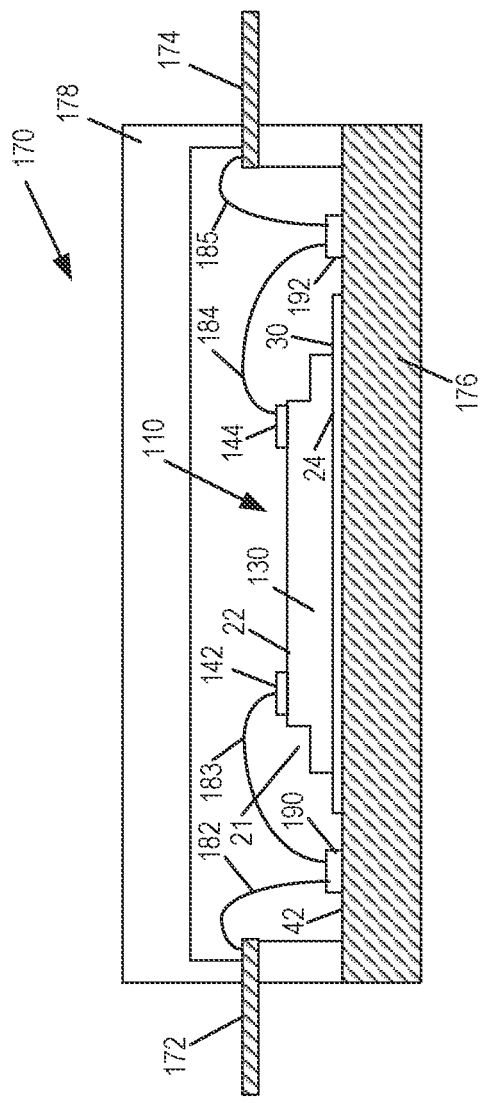
FIGS. 5A-C are schematic cross-sectional side views of respective example Group III nitride-based RF transistor amplifiers, according to particular embodiments of the present disclosure.

One example of packaging in accordance with embodiments of the present disclosure is provided in FIG. 5A. FIG. 5A is a schematic cross-sectional side view of a Group III nitride-based transistor amplifier comprising a semiconductor chip 10 within an open cavity package 170. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements. Group III nitride-based RF transistor amplifiers are typically implemented using High Electron Mobility Transistors (HEMT) and are primarily used in applications requiring high power and/or high frequency operation where Laterally Diffused Metal Oxide Semiconductor (LDMOS) RF transistor amplifiers may have inherent performance limitations. Notwithstanding, the principles described herein may, in other embodiments, be used in an LDMOS transistor.

The package 170 illustrated in FIG. 5A includes a gate lead 172, a drain lead 174, a metal flange 176 and a ceramic sidewall and lid 178. In this example, the die 20 of the semiconductor chip 10 is an RF transistor amplifier die 110 and the substrate 40 is a metal flange 176. In some embodiments, the metal flange 176 is a multilayer copper/molybdenum/copper metal flange that comprises a core molybdenum layer with copper cladding layers on either major surface thereof. The sidewalls of the ceramic sidewall and lid 178 may be formed of, for example, $Al_2O_3$. In some embodiments, the lid may be glued to the ceramic sidewalls 178 using an epoxy glue. The ceramic sidewalls and lid 178 may be attached to the metal flange 176 via braising.

The RF transistor amplifier die 110 comprises a top side metallization structure at the top surface 22, a semiconductor layer structure 130, and a bottom side metallization structure at the bottom surface 24 that are sequentially stacked. The RF transistor amplifier die 110 is mounted on the upper surface 42 of the metal flange 176 in a cavity formed by the metal flange 176 and the ceramic sidewall and lid 178. As in previous examples, a recess 21 extends around a perimeter of the RF transistor amplifier die 110.

The RF transistor amplifier 100 may be a HEMT-based RF transistor amplifier, in which case the semiconductor layer structure 130 may include at least a channel layer and a barrier layer, which are typically formed on a semiconductor or insulating growth substrate (such as a SiC or sapphire substrate). The growth substrate, even if formed of a non-semiconductor material, may be considered to be part of the semiconductor layer structure 130. The top side metallization structure includes, among other things, a metal gate terminal 142 and a metal drain terminal 144.

Input matching circuits 190 and/or output matching circuits 192 may also be mounted within the package 170. The matching circuits 190, 192 may be impedance matching circuits that match the impedance of the fundamental component of RF signals input to or output from the RF transistor amplifier to the impedance at the input or output of the RF transistor amplifier die 110, respectively, and/or harmonic termination circuits that are configured to short to ground harmonics of the fundamental RF signal that may be present at the input or output of the RF transistor amplifier die 110, such as second order or third order harmonics. As schematically shown in FIG. 5A, the input and output matching circuits 190, 192 may be mounted on the metal flange 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires 184.

The metal flange 176 may serve as a heat dissipation structure. The first through fourth bond wires 182-185 may form part of the input and/or output matching circuits. The gate lead 172 and the drain lead 174 may extend through the ceramic sidewall and lid 178. The ceramic sidewall and lid 178 may comprise multiple pieces, such as a frame that forms the lower portion of the sidewalls and supports the gate and drain leads 172, 174, and a lid that is placed on top of the frame. The interior of the device may comprise an air-filled cavity.

Figure 5B:
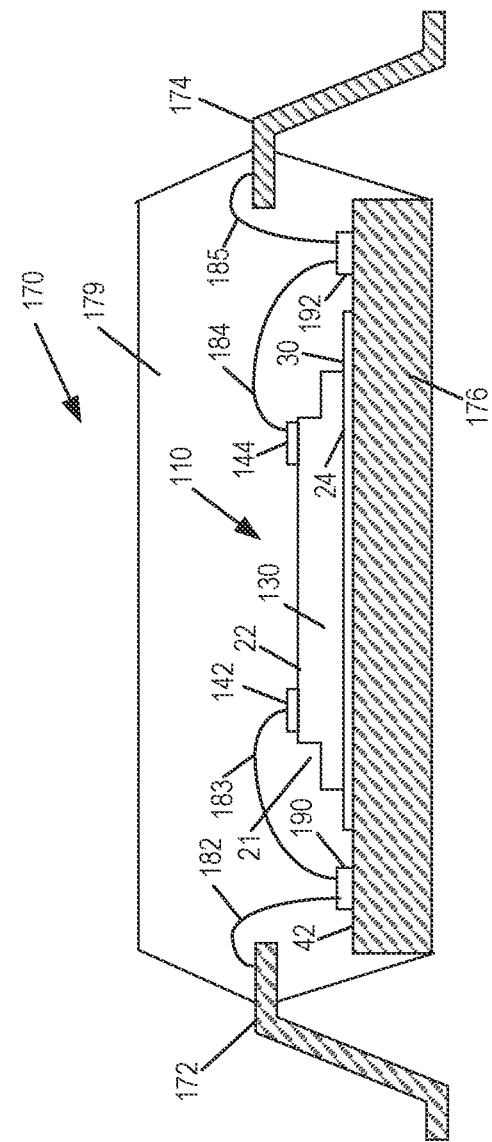

Another example of packaging in accordance with embodiments of the present disclosure is provided in FIG. 5B. FIG. 5B is a schematic cross-sectional side view of a Group III nitride-based RF transistor amplifier that is similar to the RF transistor amplifier discussed above with reference to FIG. 5A, albeit differently packaged. In FIG. 5B, the package 170 includes a metal submount 176 (which acts as a metal heat sink and can be implemented as a metal slug), as well as gate and drain leads 172, 174. In some embodiments, a metal lead frame may be formed that is then processed to provide the metal submount 176 and/or the gate and drain leads 172, 174. A recess 21 extends around a perimeter of the RF transistor amplifier die 110. The RF transistor amplifier also includes a plastic overmold 179 that at least partially surrounds the RF transistor amplifier die 110, the leads 172, 174 and the metal submount 176. Depending on the embodiment, the packaged transistor amplifier can include, for example, a MMIC as the RF transistor amplifier die 110 in which case the RF transistor amplifier die 110 incorporates multiple discrete devices. When the RF transistor amplifier die 110 is a MMIC implementation, the input matching circuits 190 and/or the output matching circuits 192 may be omitted (since they may instead be implemented within the RF transistor amplifier die 110) and the bond wires 182 and/or 185 may extend directly from the gate and drain leads 172, 174 to the gate and drain terminals 142, 144. In some embodiments, the packaged RF transistor amplifier 100 can include multiple RF transistor amplifier die that are connected in series to form a multiple stage RF transistor amplifier and/or may include multiple transistor die that are disposed in multiple paths (e.g., in parallel) to form an RF transistor amplifier with multiple RF transistor amplifier die and multiple paths, such as in a Doherty amplifier configuration.

Figure 5C:
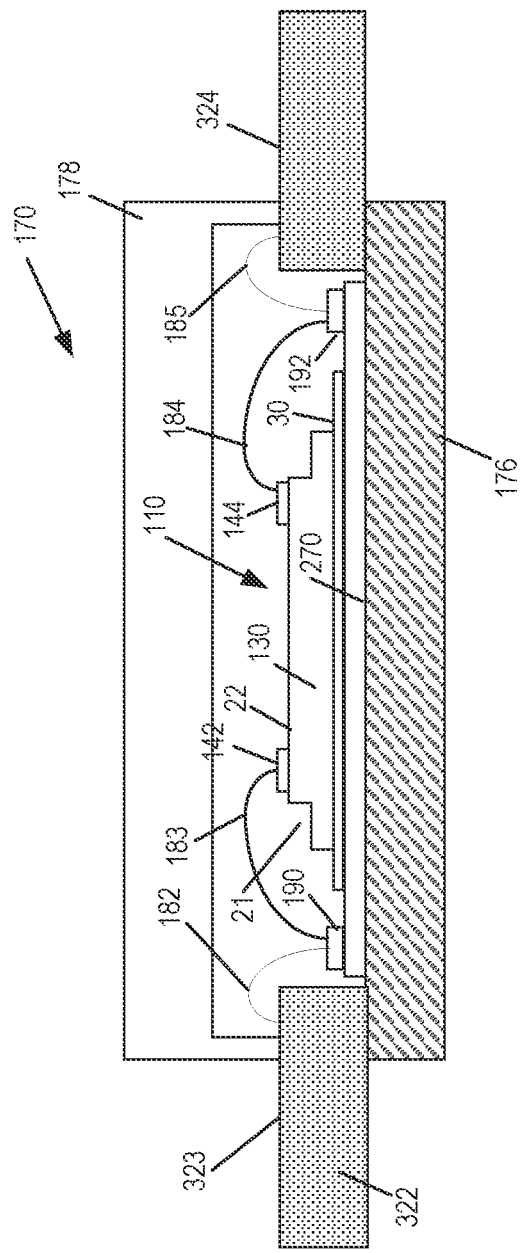

Yet another example of packaging in accordance with embodiments of the present disclosure is provided in FIG. 5C. The packaged RF transistor amplifier of FIG. 5C is very similar to the packaged RF transistor amplifier discussed above with reference to FIG. 5A, except that the leads 172, 174 are replaced with a printed circuit board 322 that includes traces 323, 324 that act as the input and output leads, respectively. The printed circuit board 322 may be attached to the metal flange 176 via, for example, a conductive glue. The printed circuit board 322 includes a central opening and an interconnection structure 270 is mounted within the opening and on the metal flange 176. In this regard, the interconnection structure 270 is the substrate 40 upon which the die attach material 30 is disposed. The RF transistor die 110 and the matching networks 190, 192, are mounted on the interconnection structure 270, each of which may be bonded to the interconnection structure by the die attach material 30 or positioned by other means.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein. Although steps of various processes or methods described herein may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention.

What is claimed is:
1. A semiconductor chip comprising:
    a substrate comprising an upper surface and a lower surface opposing the upper surface;
    a die attach material on the upper surface of the substrate; and
    a die comprising:
        a bottom surface bonded to the upper surface of the substrate by the die attach material;
        a top surface opposing the bottom surface;
        a side wall adjacent to the top surface and the bottom surface, wherein a shortest distance across an exterior of the side wall from the bottom surface to the top surface defines an exterior surface distance; and
        a die height measured from where the side wall meets the bottom surface to where the side wall meets the top surface, the exterior surface distance being longer than the die height;
    wherein the side wall comprises a first vertical surface, a second vertical surface, and an intermediate surface that is adjacent to each of the first vertical surface and the second vertical surface;
    wherein the first vertical surface and second vertical surface are laterally offset from each other; and
    wherein the intermediate surface is non-perpendicular to each of the first vertical surface and the second vertical surface.

2. The semiconductor chip of claim 1, wherein the intermediate surface forms interior angles with the first and second vertical surfaces and one of the interior angles is between thirty-five degrees and fifty-five degrees.

3. The semiconductor chip of claim 1, wherein the intermediate surface is spaced over the die attach material.

4. The semiconductor chip of claim 1, wherein the intermediate surface forms an acute exterior angle with the first vertical surface and an acute interior angle with the second vertical surface.

5. The semiconductor chip of claim 1, wherein:
    the intermediate surface comprises a first intermediate surface and a second intermediate surface;
    the first intermediate surface and the first vertical surface meet to form an exterior obtuse angle; and
    the second intermediate surface and the second vertical surface meet to form an acute interior angle.

6. The semiconductor chip of claim 1, wherein:
    the first vertical surface is adjacent to the top surface;
    the second vertical surface is adjacent to the bottom surface;
    the intermediate surface is curved such that a concave cavity in the side wall is formed;
    the intermediate surface increasingly straightens as the intermediate surface approaches the first vertical surface; and
    the intermediate surface forms an acute interior angle with the second vertical surface.

7. The semiconductor chip of claim 1, wherein:
    the first vertical surface is adjacent to the top surface;
    the second vertical surface is adjacent to the bottom surface;
    the first vertical surface is curved such that a concave cavity in the side wall is formed;
    the intermediate surface is curved in a direction opposite that of the first vertical surface such that a protrusion is formed; and
    the intermediate surface increasingly straightens as the intermediate surface approaches the second vertical surface.

8. The semiconductor chip of claim 1, wherein the die attach material is silver sintered.

9. The semiconductor chip of claim 1, wherein the exterior surface distance is longer than the die height by at least 5 microns.

10. The semiconductor chip of claim 1, wherein the semiconductor chip is air cavity packaged.

11. The semiconductor chip of claim 1, further comprising a gallium nitride-based high-electron-mobility transistor.

12. The semiconductor chip of claim 1, further comprising a gallium nitride-based monolithic microwave integrated circuit.

13. The semiconductor chip of claim 1, further comprising a gallium nitride-based transistor grown on silicon carbide.

14. The semiconductor chip of claim 1, further comprising a silicon carbide-based metal-oxide-semiconductor field-effect transistor.

15. The semiconductor chip of claim 1, wherein the first vertical surface and the second vertical surface are each adjacent to either the top surface or the bottom surface of the die.

16. A semiconductor chip comprising:
a substrate comprising an upper surface and a lower surface opposing the upper surface;
a die attach material on the upper surface of the substrate; and
a die comprising:
a bottom surface bonded to the upper surface of the substrate by the die attach material;
a top surface that opposes, and is narrower than, the bottom surface; and
a side wall adjacent to the top surface and the bottom surface, wherein the side wall comprises:
a recess that is at least 5 microns deep and that extends around a perimeter of the die; and
a first vertical surface, a second vertical surface, and an intermediate surface that is adjacent to each of the first vertical surface and the second vertical surface;
wherein the first vertical surface and second vertical surface are laterally offset from each other; and
wherein the intermediate surface is non-perpendicular to each of the first vertical surface and the second vertical surface.

17. The semiconductor chip of claim 16, wherein the intermediate surface forms interior angles with the first and second vertical surfaces and one of the interior angles is between thirty-five degrees and fifty-five degrees.

18. The semiconductor chip of claim 16, wherein the intermediate surface is spaced over the die attach material.

19. The semiconductor chip of claim 16, wherein the intermediate surface forms an acute exterior angle with the first vertical surface and an acute interior angle with the second vertical surface.

20. The semiconductor chip of claim 16, wherein:
the intermediate surface comprises a first intermediate surface and a second intermediate surface;
the first intermediate surface and the first vertical surface meet to form an exterior obtuse angle; and
the second intermediate surface and the second vertical surface meet to form an acute interior angle.

21. The semiconductor chip of claim 16, wherein:
the first vertical surface is adjacent to the top surface;
the second vertical surface is adjacent to the bottom surface;
the intermediate surface is curved such that a concave cavity in the side wall is formed;
the intermediate surface increasingly straightens as the intermediate surface approaches the first vertical surface; and
the intermediate surface forms an acute interior angle with the second vertical surface.

22. The semiconductor chip of claim 16, wherein:
the first vertical surface is adjacent to the top surface;
the second vertical surface is adjacent to the bottom surface;
the first vertical surface is curved such that a concave cavity in the side wall is formed;
the intermediate surface is curved in a direction opposite that of the first vertical surface such that a protrusion is formed; and
the intermediate surface increasingly straightens as the intermediate surface approaches the second vertical surface.

23. The semiconductor chip of claim 16, wherein the die attach material is silver sintered.

24. The semiconductor chip of claim 16, wherein the semiconductor chip is air cavity packaged.

25. The semiconductor chip of claim 16, further comprising a gallium nitride-based high-electron-mobility transistor.

26. The semiconductor chip of claim 16, further comprising a gallium nitride-based monolithic microwave integrated circuit.

27. The semiconductor chip of claim 16, further comprising a gallium nitride-based transistor grown on silicon carbide.

28. The semiconductor chip of claim 16, further comprising a silicon carbide-based metal-oxide-semiconductor field-effect transistor.

29. The semiconductor chip of claim 16, wherein the first vertical surface and the second vertical surface are each adjacent to either the top surface or the bottom surface of the die.

* * * * *